United States Patent
Chang et al.

(10) Patent No.: US 7,075,227 B2
(45) Date of Patent: Jul. 11, 2006

(54) ORGANIC ELECTROLUMINESCENCE DISPLAY DEVICE

(75) Inventors: Yih Chang, Hsinchu (TW); Tien-Rong Lu, Hsinchu (TW)

(73) Assignee: RiTdisplay Corporation, Hsinchu (TW)

( * ) Notice: Subject to any disclaimer, the term of this patent is extended or adjusted under 35 U.S.C. 154(b) by 198 days.

(21) Appl. No.: 10/814,217

(22) Filed: Mar. 30, 2004

(65) Prior Publication Data

US 2004/0189187 A1    Sep. 30, 2004

(30) Foreign Application Priority Data

Mar. 31, 2003  (TW) .............................. 92107664 A

(51) Int. Cl.
*H01J 63/04*  (2006.01)
(52) U.S. Cl. ..................... 313/504; 313/506; 428/690; 349/69
(58) Field of Classification Search ................ 313/504, 313/506, 503, 509, 502; 428/690; 359/296; 349/68, 69, 70, 61, 63
See application file for complete search history.

(56) References Cited

U.S. PATENT DOCUMENTS

| 5,442,478 | A | * | 8/1995 | Lampert et al. | ............. 359/273 |
| 5,444,330 | A | * | 8/1995 | Leventis et al. | ............. 313/506 |
| 6,917,159 | B1 | * | 7/2005 | Tyan et al. | .................. 313/506 |
| 7,002,294 | B1 | * | 2/2006 | Forrest et al. | .............. 313/506 |

\* cited by examiner

*Primary Examiner*—Edward J. Glick
*Assistant Examiner*—Elizabeth Keaney
(74) *Attorney, Agent, or Firm*—J.C. Patents

(57) ABSTRACT

An organic electroluminescence display device is provided. The OEL device includes a substrate, a first electrode layer, a second electrode layer, an organic functional layer and at least one electrochromic medium layer. The first electrode layer is disposed on the substrate, the second electrode layer is disposed over the first electrode layer, and the organic functional layer and the electrochromic medium layer are disposed between the first electrode layer and the second electrode layer. Accordingly, the electrochromic medium layer is provided as a selective light valve to improve the reflection of the external light, and thus the contrast ratio of the organic electroluminescence display device is enhanced.

16 Claims, 3 Drawing Sheets

ORGANIC ELECTROLUMINESCENCE DISPLAY DEVICE

CROSS-REFERENCE TO RELATED APPLICATION

This application claims the priority benefit of Taiwan application serial no. 92107664, filed on Mar. 31, 2003.

BACKGROUND OF THE INVENTION

1. Field of the Invention

The present invention generally relates to an organic electroluminescence (OEL) display device. More particularly, the present invention relates to organic electroluminescence display device having selective light valve.

2. Description of Related Art

In recent years, communication appliance has become more and more important. Especially, portable communication appliance is the major stream of the communication appliance. In the development of the portable communication appliance, the flat panel display (FPD) used for the communication interface between the user and the appliance is important. The conventional flat panel display (FPD) may be generally classified into plasma display panel (PDP), liquid crystal display (LCD), inorganic electro-luminescent display, light emitting diode (LED), vacuum fluorescence display and field emission display (FED). However, in comparison with other flat plane display device, the organic electroluminescence device has the advantages of self-luminescence, non-viewing angle dependence, power saving, easy process, low-cost, low temperature range of operation, high response speed and full-color. Therefore, the organic electroluminescence device has the potential to be the next generation flat panel display (FPD).

The organic electroluminescence component is used as a displaying device by using the characteristic of the self-luminescence of the organic functional material. The organic electroluminescence component is classified into small molecular organic light emitting component (SM-OLED) and polymer organic light emitting component (PLED) according to the molecular weight of the organic functional material. The structure for light emitting of the organic electroluminescence component is mainly constructed by a pair of electrodes and an organic functional material layer. When a current is applied between the pair of electrodes, exciton will be generated by the combination of electron and hole in the organic functional material layer. Thus, different color light is emitted by the exciton, and the color of the light emitted is dependent on the characteristic of the material of the organic functional material layer.

For any display device, the brightness discrimination is dependent on the ratio of the brightness between fully turned on and fully turned off, wherein the brightness ratio is generally called a contrast ratio (CR). The brightness discrimination is proportional to the contrast ratio. The conventional contrast ratio is generally defined as below:

$$CR = \frac{L_{sub,on} + R_{amb}}{L_{sub,off} + R_{amb}} \quad (1)$$

In equation (1), $L_{sub,on}$ is defined as the brightness of the pixel being fully turned on, $L_{sub,off}$ is the brightness of the pixel being fully turned off, and $R_{amb}$ is the reflected brightness of the external light being incident into the display device. When the $L_{sub,on}$ and the $L_{sub,off}$ of the pixel are known (for example, $L_{sub,on}$ is about 100 nits and $L_{sub,off}$ is about 1 nit), the relationship between the contrast ratio and the reflected brightness of the external light $R_{amb}$ can be calculated according to equation (1). It is noted that, the larger the reflected brightness of the external light $R_{amb}$, the smaller the contrast ratio, i.e., the worse the brightness discrimination. However, the only way is to enhance the $L_{sub,on}$ of the pixel to increase the contrast ration and obtain an applicable contrast ratio of the display device. Alternatively, the smaller the reflected brightness of the external light $R_{amb}$, the larger the contrast ratio, thus the $L_{sub,on}$ of the pixel may be decreased to obtain an applicable contrast ratio. In general, the lower the $L_{sub,on}$ of the pixel, the lower the power consumption and the lower harsh to the eyes.

FIG. 1 is a drawing schematically illustrating a conventional organic electroluminescence display device. Referring to FIG. 1, a conventional organic electroluminescence display device includes a substrate 100, a transparent electrode layer 102, an organic functional layer 104 and a metal electrode layer 106. The substrate 100 generally includes glass substrate. The transparent electrode layer 102 is generally composed of transparent conductive material such as indium tin oxide (ITO). The organic functional layer 104 is generally an organic multilayer comprising a hole injection layer, a hole transport layer, an organic electroluminescence layer, an electron transport layer and an electron injection layer. The metal electrode layer 106 is generally composed of aluminum, calcium or alloy of magnesium and silver. It is noted that, when current is applied between the transparent electrode layer 102 and the metal electrode layer 106, excitons will be generated by the recombination of electrons and holes in the organic functional layer 104 and light will be emitted. The mechanism of luminescence of different color of light is dependent on the characteristic of the material of the organic functional layer 104. In summary, the principle of displaying of the organic electroluminescence display device is to convert electric energy to photon energy by the driving of a current.

Referring to FIG. 1, the refractive index $n_1$ of the organic functional layer 104 is very close to the refractive index $n_2$ of the transparent anode layer 102. The refractive index $n_1$ of the organic functional layer 104 is, for example, larger than the refractive index $n_3$ of the transparent substrate 100. In general, $n_1$ is about 1.7, $n_2$ is between 1.8 and 2.0, and $n_3$ is about 1.5 and larger than the refractive index of air ($\approx 1$).

In summary, the light of the organic electroluminescence display device is emitted by the organic functional layer 104, and the light has arbitrary propagation direction. However, the metal electrode layer 106 may be provided as a reflection layer so reflect the light, therefore, the light may only propagate in the direction from the metal electrode layer 106 to the substrate 100. In general, the emitted light described above may be influenced by the external light, and thus the brightness discrimination is reduced. For example, referring to FIG. 1, when the external light is incident to the organic electroluminescence display device, the external light will be reflected by the interface between the air and the transparent substrate 100, the interface between the transparent substrate 100 and the transparent electrode layer 102, and the interface between the organic functional layer 104 and the metal electrode layer 106. All the reflected light will propagate in the direction from metal electrode layer 106 to the substrate 100.

For example, referring to FIG. 1, the reflected light $W_1$ from the interface between the air and the transparent substrate 100 is about 4% of the incident external light W.

The reflected light $W_2$ from the transparent substrate 100 and the transparent electrode layer 102 is about 0.8% of the incident external light W. The reflected light $W_3$ from the organic functional layer 104 and the metal electrode layer 106 is over 90%. Therefore, almost all the reflected light is reflected by the metal electrode layer 106. In other words, almost all the reflected light is generated by the interface between the organic functional layer 104 and the metal electrode layer 106. Thus, if the organic electroluminescence display device is used outdoors with strong external light, the contrast ratio is reduced obviously due to the reflected external light. Therefore, how to reduce the incidence of the strong external light to the interface between the organic functional layer 104 and the metal electrode layer 106 is the most important issue to be solved to enhance the contrast ratio of the organic electroluminescence display device under strong external light.

One of the conventional technologies provides a polarizer attached to the surface of the display device, or provides a photo sensor and an adjusting device of contrast ratio to solve the problem described above. However, these two methods have the disadvantages below. First, the reflected external light is reduced by the polarizer, however, the light emitted by the device is also reduced by the polarizer, therefore the contrast of the display device is not enhanced and is not applicable for the display device to be used outdoors. Next, the photo sensor and the adjusting device of the contrast ratio are dependent on the intensity of the external light, thus the cost is high.

SUMMARY OF THE INVENTION

Therefore, the present invention is directed to an organic electroluminescence display device having a selective light valve. The selective light valve is used to forbidden the transmission of the external light to the pixel being turned off and used to allow the transmission of the external light to the pixel being turned on respectively. Therefore, the contrast ratio and the brightness discrimination of the display device are enhanced.

In the present invention an organic electroluminescence display device is provided. The display device comprises a substrate, a first electrode layer, a second electrode layer, an organic functional layer and at least one electrochromic medium layer. The first electrode layer is disposed on the substrate, and the second electrode layer is disposed over the first electrode layer. The organic functional layer is disposed between the first electrode layer and the second electrode layer. The electrochromic medium layer is disposed between the first electrode layer and the second electrode layer. Therefore, the transmittance of the electrochromic medium layer is changed by the oxidation and reduction reaction or the hydrogen bonding reaction of the electrochromic medium when a current is applied. Thus, the transmittance of the electrochromic medium layer may be used as a selective light valve.

In one embodiment of the invention, the organic functional layer is, for example but not limited to, disposed over the first electrode layer, and the electrochromic medium layer is disposed between the organic functional layer and the second electrode layer. Or, the electrochromic medium layer is, for example but not limited to, disposed over the first electrode layer, and the organic functional layer is disposed between the electrochromic medium layer and the second electrode layer. The organic functional layer is, for example but not limited to, an organic electroluminescence layer. In addition, a hole injection layer and a hole transport layer may be further disposed between the first electrode layer and the organic electroluminescence layer. Moreover, an electron transport layer and an electron injection layer may be selectively disposed between the second electrode layer and the organic electroluminescence layer. The electrochromic medium layer described above may be disposed between any two of the hole injection layer, the hole transport layer, the organic electroluminescence layer, the electron transport layer and the electron injection layer described above.

In one embodiment of the invention, the electrochromic medium layer material is composed, for example but not limited to, transition metal oxide, Prussian compound, viologens, conductive polymer, transition metal, lanthanide coordination complexes, metallopolymers, metal phthalocyanines or the combination thereof. The transition metal oxide comprises, for example but not limited to, $WO_3$, $MoO_3$, $V_2O_5$, $Nb_2O_5$, $Ir(OH)_3$, $NiO_xH_y$, or the combination thereof. The Prussian compound comprises, for example but not limited to, $[Fe^{III}Fe^{II}(CN)_6]^-$, $[Fe^{III}Fe^{III}(CN)_6]$, $[Fe^{II}Fe^{II}(CN)_6]^{2-}$ or the combination thereof. The viologens comprises, for example but not limited to, 1,1'-disubstituted-4,4'-bipyridinium salts. The conductive polymer comprises, for example but not limited to, polypyrrole, polythiophene, polyaniline, PEDOT or the combination thereof. The transition metal, lanthanide coordination complexes and metallopolymers comprises, for example but not limited to, metal hydride, nitrosyl, oxo molybdenum complexes, poly-[$Ru^{II}$(vbpy)$_2$(py)$_2$]$^-$Cl$_2$ or the combination thereof. The metal phthalocyanines comprises, for example but not limited to, [Lu(Pc)$_2$].

In addition, the present invention provides an organic electroluminescence display device. The display device comprises a first substrate, a first electrode layer, a second electrode layer, an organic functional layer and a selective light valve. The first substrate comprises a displaying surface. The first electrode layer is disposed on the first substrate, and the second electrode layer is disposed over the first electrode layer. The organic functional layer is disposed between the first electrode layer and the second electrode layer. The selective light valve is disposed on the displaying surface of the first substrate.

In one embodiment of the present invention, at least one electrochromic medium layer is further disposed between the first electrode layer and the second electrode layer.

In one embodiment of the present invention, the selective light valve comprises, for example but not limited to, a liquid crystal light valve. The liquid crystal light valve comprises a second substrate, a third substrate and a liquid crystal layer. The third substrate is disposed on the displaying surface of the first substrate, and the liquid crystal layer is disposed between the second substrate and the third substrate. In another embodiment of the invention, the third substrate is optional and may be omitted, and the liquid crystal layer is disposed between the displaying surface of the first substrate and the second substrate. Thus, the cost and the thickness of the organic electroluminescence display device are all reduced.

In one embodiment of the present invention, the selective light valve comprises, for example but not limited to, an electrochromic medium layer. The electrochromic medium layer is composed of, for example but not limited to, transition metal oxide, Prussian compound, viologens, conductive polymer, transition metal, lanthanide coordination complexes, metallopolymers, metal phthalocyanines or the combination thereof. The transition metal oxide comprises, for example but not limited to, $WO_3$, $MoO_3$, $V_2O_5$, $Nb_2O_5$, $Ir(OH)_3$, $NiO_xH_y$ or the combination thereof The Prussian compound comprises, for example but not limited to, $[Fe^{III}Fe^{II}(CN)_6]^-$, $[Fe^{III}Fe^{III}(CN)_6]$, $[Fe^{II}Fe^{II}(CN)_6]^{2-}$ or the combination thereof. The viologens comprises, for example but not limited to, 1,1'-disubstituted-4,4'-bipyridinium salts. The first conductive polymer comprises, for example but not limited to, polypyrrole, polythiophene, polyaniline, PEDOT or the combination thereof. The transition metal, lanthanide coordination complexes and metallopolymers comprises, for example but not limited to, metal hydride, nitrosyl, oxo molybdenum complexes, poly-$[Ru^{II}(vbpy)_2(Py)_2]^-Cl_2$ or the combination thereof. The metal phthalocyanines comprises, for example but not limited to, $[Lu(Pc)_2]$.

Accordingly, the present invention provides a selective light valve for the organic electroluminescence display device. For the pixel being turned off, the selective light valve can avoid the transmission of the external light, thus the reflected light of the external light from the organic light emitting component is reduced. For the pixel being turned on, the selective light valve can allow the transmission of the external light, thus the brightness of the pixel being turned on is enhanced. Thus, the contrast ratio and the brightness discrimination of the organic electroluminescence display device under strong light are enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
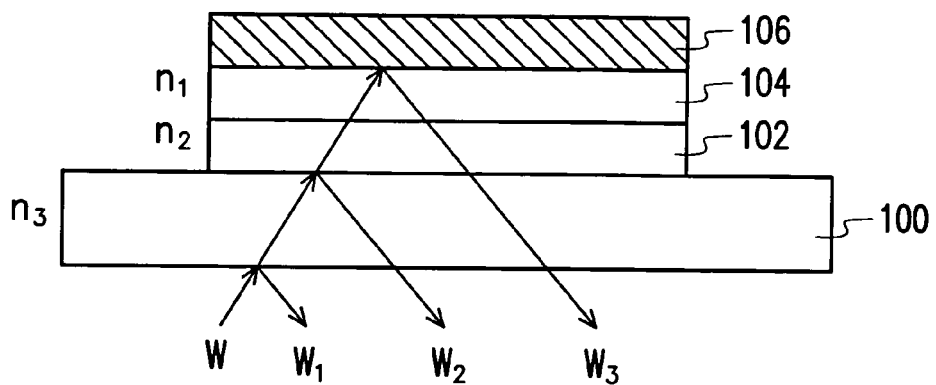
FIG. 1 is a drawing schematically illustrating a conventional organic electroluminescence display device.
Figure 2:
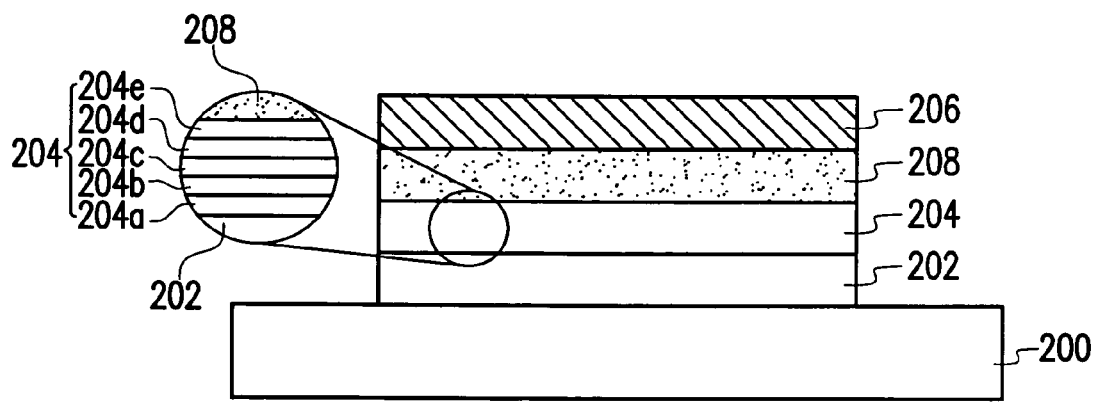
FIG. 2 is a drawing schematically illustrating an organic electroluminescence display device according to one embodiment of the present invention.

FIG. 2 is a drawing schematically illustrating an organic electroluminescence display device according to one embodiment of the present invention. Referring to FIG. 2, the organic electroluminescence display device comprises, for example but not limited to, a substrate 200, a first electrode layer 202, an organic functional layer 204, a second electrode layer 206 and an electrochromic medium layer 208. The substrate 200 comprises, for example but not limited to, glass substrate or other transparent substrate. The first electrode layer 202 is disposed on the substrate 200. The first electrode layer 202 is, for example, a transparent electrode layer composed of transparent conductive material such as indium tin oxide (ITO). The second electrode layer 206 is disposed over the first electrode layer 202. The second electrode layer 206 is, for example, a metal electrode comprises of aluminum, calcium or alloy of magnesium and silver.

The organic functional layer 204 is disposed between the first electrode layer 202 and the second electrode layer 206. The organic functional layer 204 comprises, for example but not limited to, organic multilayer comprising a hole injection layer 204a, a hole transport layer 204b, an organic electroluminescence layer 204c, an electron transport layer 204d and an electron injection layer 204e. It is noted that, since the light emitted by the organic electroluminescence display device is generated from the organic electroluminescence layer 204c, the above-described hole injection layer 204a, hole transport layer 204b, electron transport layer 204d and electron injection layer 204e are optional in the manufacturing process.

For example, in a passive matrix display, the first electrode layer 202 and the second electrode layer 206 comprise, for example but not limited to, a plurality of mutually perpendicular line structures, wherein a pixel region is constructed by the intersection between the two electrode layers. When a current is applied between the first electrode layer 202 and the second electrode layer 206, and excitons is generated by the recombination of electrons and holes in the organic functional layer 204, a light is emitted. The mechanism of luminescence of different color emitted light is dependent on the characteristic of the material of the organic functional layer 204. In other words, electric energy is converted to photon energy by the driving of a current to emit a light for displaying of the organic electroluminescence display device.

Referring to FIG. 2, the electrochromic medium layer 208 is disposed between the organic functional layer 204 and the second electrode layer 206. The electrochromic medium layer 208 is comprised of, for example but not limited to, transition metal oxide, Prussian compound, viologens, conductive polymer, transition metal, lanthanide coordination complexes, metallopolymers, metal phthalocyanines or the combination thereof.

The transition metal oxide comprises, for example but not limited to, $WO_3$, $MoO_3$, $V_2O_5$, $Nb_2O_5$, $Ir(OH)_3$, $NiO_xH_y$ or the combination thereof. The Prussian compound comprises, for example but not limited to, $[Fe^{III}Fe^{II}(CN)_6]^-$, $[Fe^{III}Fe^{III}(CN)_6]$, $[Fe^{II}Fe^{II}(CN)_6]^{2-}$ or the combination thereof. The viologens comprises, for example but not limited to, 1,1'-disubstituted-4,4'-bipyridinium salts. The conductive polymer comprises, for example but not limited to, polypyrrole, polythiophene, polyaniline, PEDOT or the combination thereof. The transition metal, the lanthanide coordination complexes and the metallopolymers comprises, for example but not limited to, metal hydride, nitrosyl, oxo molybdenum complexes, poly-[Ru$^{II}$(vbpy)$_2$(py)$_2$]$^-$Cl$_2$ or the combination thereof. The metal phthalocyanines comprises, for example but not limited to, [Lu(Pc)$_2$].

For example, when the electrochromic medium layer 208 is composed of transition metal oxide, it is divided into the two types described below:

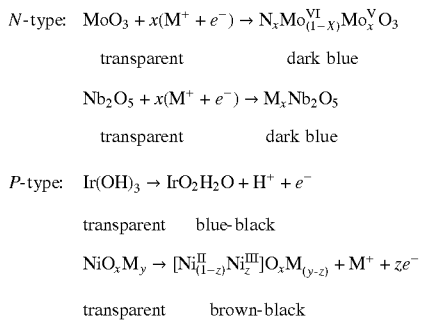

For a bottom emission organic electroluminescence display device (light is emitted from the bottom surface of the substrate), the electrochromic medium layer 208 is preferably composed of P-type transition metal oxide, wherein for the NiO$_x$M$_y$, M$^+$ comprises H$^+$, Li$^+$, Na$^+$, or K$^+$. For example, if the electrochromic medium layer 208 is composed of Li$_x$Ni$_{1-x}$O, the Li$_x$Ni$_{1-x}$O thin film layer can be deposited on the ITO glass substrate by sputtering or laser vapor deposition process using target constructed by compressed mixture of nickel oxide and lithium oxide powders. If the electrochromic medium layer 208 is composed of NiO$_x$H$_y$, the NiO$_x$H$_y$ thin film can be manufactured by the following steps. First, a nickel oxide thin film is manufactured by magnetron sputtering process using pure nickel target under 10 mTorr O$_2$. Then the NiO$_x$H$_y$ thin film layer is obtained by a reaction of the nickel oxide thin film layer with 1M KOH solution.

According to the chemical reactions described above, when a current is applied between the first electrode layer 202 and the second electrode layer 206, the electrochromic medium layer 208 will be oxidized and reduced and thus has different color and transmittance. In other words, the electrochromic medium layer 208 may be used as a selective light valve having different color and transmittance according to the turning on and off of the pixel of the organic electroluminescence display device.

For example, for the pixel being turned off, since the current is not applied, the electrochromic medium layer 208 is nearly non-transparent and has a light shielding effect. Therefore, the incidence and the reflection of the external light to and from the organic electroluminescence component are all reduced. For the pixel being turned on, since the current is applied, the electrochromic medium layer 208 is transparent, thus the external light is incident to and reflected from the organic electroluminescence component. Thus, the brightness of the pixel being turned on is enhanced. In summary, for the whole organic electroluminescence display device, the contrast ratio under a strong light is enhanced, and thus the brightness discrimination of the display device is also increased.

Accordingly, the present embodiment provides an electrochromic medium layer 208 disposed between the organic functional layer 204 and the second electrode layer 206. Thus, the incidence of the strong external light to the interface between the organic functional layer 204 and the second electrode layer 206 is reduced. However, in another embodiment of the present invention, the electrochromic medium layer 208 may also be disposed between the first electrode layer 202 and the organic functional layer 204 (not shown), or may be disposed between any two of the above-described hole injection layer 204a, hole transport layer 204b, organic electroluminescence layer 204c, electron transport layer 204d and electron injection layer 204e (not shown). In any one embodiment of the invention, the brightness discrimination of the display device can be increased.

Figure 3:
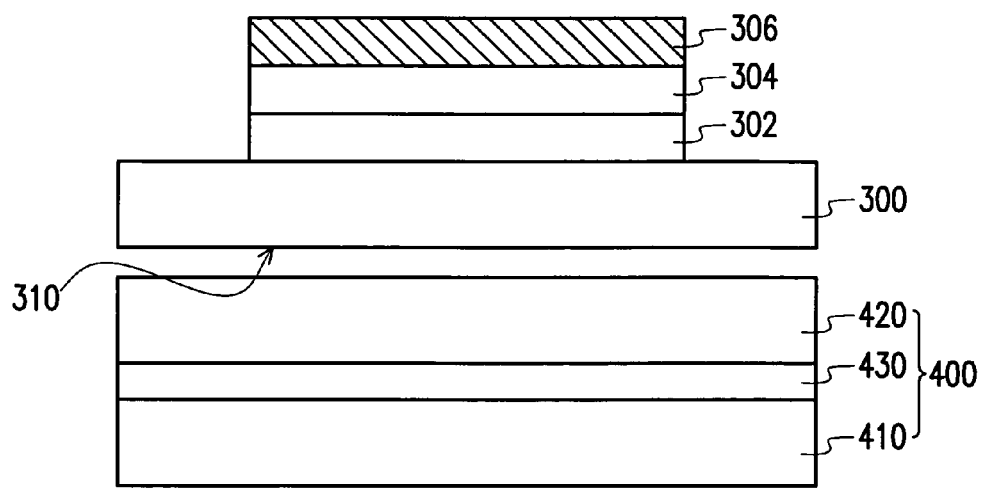
FIG. 3 is a drawing schematically illustrating an organic electroluminescence display device according to one embodiment of the present invention.

FIG. 3 is a drawing schematically illustrating an organic electroluminescence display device according to one embodiment of the present invention. Referring to FIG. 3, the organic electroluminescence display device comprises, for example but not limited to, a first substrate 300, a first electrode layer 302, an organic functional layer 304, a second electrode layer 306 and a selective light valve 400. The first substrate 300 comprises, for example but not limited to, glass substrate or other transparent substrate. The first substrate 300 has a displaying surface 310. The first electrode layer 302 is disposed on the first substrate 300, the first electrode layer 302 is, for example but not limited to, a transparent electrode layer composed of, transparent conductive material such as indium tin oxide (ITO). The second electrode layer 306 is disposed over the first electrode layer 302. The second electrode layer 306 comprises, for example but not limited to, metal electrode layer composed of aluminum, calcium or alloy of magnesium and silver. The organic functional layer 304 is disposed between the first electrode layer 302 and the second electrode layer 306 and comprises organic multilayer similar to the embodiments described above. The selective light valve 400 is disposed over the displaying surface 310 of the first substrate 300.

The selective light valve 400 comprises, for example but not limited to, a second substrate 410, a third substrate 420 and a liquid crystal layer 430. The second substrate 410 and the third substrate 420 comprise, for example but not limited to, glass substrate or other transparent substrate. The third substrate 420 is disposed on or over the displaying surface 310 of the first substrate 300, and the liquid crystal layer 430 is disposed between the second substrate 410 and the third substrate 420. The selective light valve 400 is provided for controlling the passing through of the external light or not. For example, for the pixel being turned off, the transmission of the external light to the displaying device is forbidden, thus the reflected light due to the reflection of the external light incident to the organic electroluminescence component is reduced. However, for the pixel being turned on, the transmission of the external light to the display device is allowed, thus the brightness of the pixel being turned on is enhanced. Therefore, the contrast ratio of the organic electroluminescence display device under a strong external light is enhanced, and the brightness discrimination of the display device is also enhanced.

It is noted that, for the selective light valve 400 (i.e., a so-called liquid crystal light valve) of the present invention, it is not necessary to dispose an upper and a lower polarizers on the external surface of the second substrate 410 and the third substrate 420 as disposed in conventional LCD device. In the present invention, only the liquid crystal layer 430 is used as a light valve to selective shield the external light under a driving voltage. Thus, the brightness discrimination of the organic electroluminescence display device is enhanced.

Figure 4:
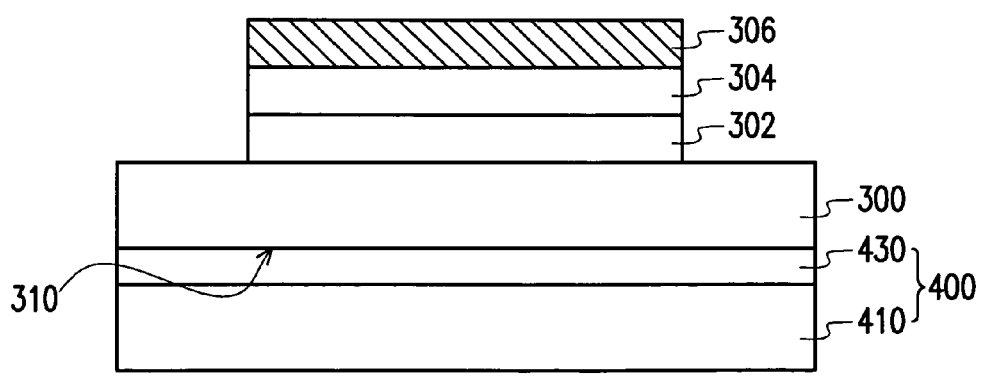
FIG. 4 is a drawing schematically illustrating an organic electroluminescence display device according to one embodiment of the present invention.

FIG. 4 is a drawing schematically illustrating an organic electroluminescence display device according to one embodiment of the present invention. Referring to FIG. 4, the structure of the organic electroluminescence display device is similar to that shown in FIG. 3 except for that the third substrate 420 in FIG. 3 is omitted in FIG. 4. Therefore, the liquid crystal layer 430 is disposed on or over the displaying surface 310 of the first substrate 300. In other words, the thin film transistor (TFT) and the alignment film may be disposed on or over the displaying surface 310 of the first substrate 300, and thus the liquid crystal layer 430 and the OEL device are disposed on the same substrate. Thus, the thickness of the organic electroluminescence display device may be further reduced.

In the embodiments described above, a selective light valve such as an electrochromic medium layer or a liquid crystal light valve is provided for the organic electroluminescence display device. However, in another embodiment of the invention described hereinafter, more than one type of selective light valve may be disposed in the organic electroluminescence display device.

Figure 5:
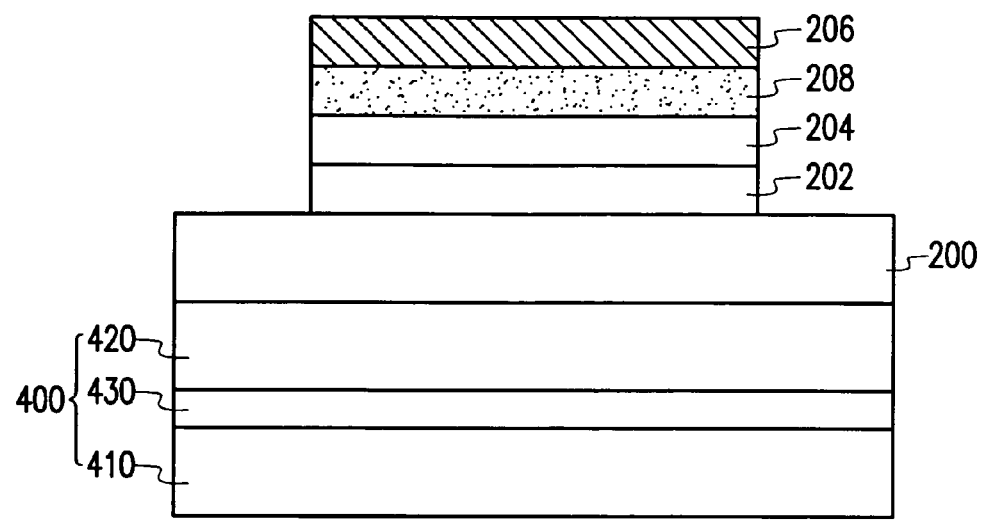
FIG. 5 is a drawing schematically illustrating comprises an organic electroluminescence display device according to one embodiment of the present invention.

FIG. 5 is a drawing schematically illustrating an organic electroluminescence display device according to one embodiment of the present invention. It is noted that, the display device shown in FIG. 5 comprising the electrochromic medium layer 208 shown in FIG. 2 and the selective light valve 400 (i.e., the liquid crystal light valve) shown in FIG. 3 simultaneously. Therefore, the organic electroluminescence display device shown in FIG. 5 has the advantages and characteristics of the electrochromic medium layer 208 and the selective light valve 400 (liquid crystal light valve) described above. Thus, the brightness discrimination of the organic electroluminescence display device is further enhanced.

Figure 6:
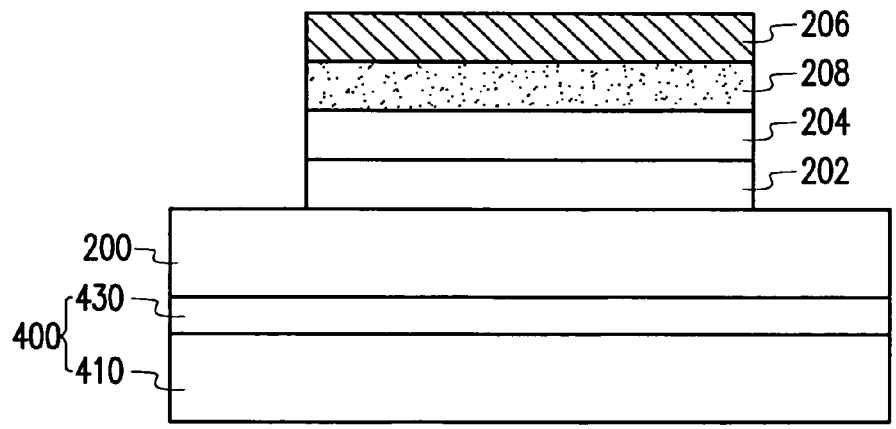
FIG. 6 is a drawing schematically illustrating an organic electroluminescence display device according to one embodiment of the present invention.

FIG. 6 is a drawing schematically illustrating an organic electroluminescence display device according to one embodiment of the present invention. It is noted that, the display device shown in FIG. 6 comprising the electrochromic medium layer 208 shown in FIG. 2 and the selective light valve 400 (i.e., the liquid crystal light valve) shown in FIG. 4 simultaneously. Therefore, the organic electroluminescence display device shown in FIG. 6 has the advantages and characteristics of the electrochromic medium layer 208 and the selective light valve 400 (liquid crystal light valve) described above. Thus, the brightness discrimination of the organic electroluminescence display device is further enhanced and the thickness of the electroluminescence display device is further reduced.

Accordingly, the organic electroluminescence display device of the invention at least has the following advantages. First, the organic electroluminescence display device of the present invention provides at least one selective light valve to forbidden the transmission of the external light to the pixel being turned off. Thus, the reflection of the external light due to the interface between the metal electrode layer and the organic functional layer is reduced. In addition, the contrast ratio, the brightness discrimination and the displaying quality of the organic electroluminescence component under strong light is enhanced.

Next, the organic electroluminescence display device of the present invention provides a selective light valve to allow the transmission of the external light to the pixel being turned on. Thus, the reflected light of the external light may be used to enhance the luminous efficiency and the contrast of the organic light emitting component.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic electroluminescence display device, comprising:
   a substrate;
   a first electrode layer, disposed on the substrate;
   a second electrode layer, disposed over the first electrode layer;
   an organic functional layer, disposed between the first electrode layer and the second electrode layer; and
   at least one electrochromic medium layer, disposed between the first electrode layer and the second electrode.

2. The organic electroluminescence display device of claim 1, wherein the organic functional layer is disposed over the first electrode layer, and the electrochromic medium layer is disposed between the organic functional layer and the second electrode layer.

3. The organic electroluminescence display device of claim 1, wherein the electrochromic medium layer is disposed over the first electrode layer, and the organic functional layer is disposed between the electrochromic medium layer and the second electrode layer.

4. The organic electroluminescence display device of claim 1, wherein the organic functional layer comprises at least one organic electroluminescence layer.

5. The organic electroluminescence display device of claim 4, wherein the organic functional layer further comprises a hole injection layer disposed between the first electrode layer and the organic electroluminescence layer.

6. The organic electroluminescence display device of claim 5, wherein the organic functional layer further comprises a hole transport layer disposed between the hole injection layer and the organic electroluminescence layer.

7. The organic electroluminescence display device of claim 6, wherein the organic functional layer further comprises an electron injection layer disposed between the second electrode layer and the organic electroluminescence layer.

8. The organic electroluminescence display device of claim 7, wherein the organic functional layer further comprises an electron transport layer disposed between the electron injection layer and the organic electroluminescence layer.

9. The organic electroluminescence display device of claim 8, wherein the electrochromic medium layer is disposed between any two of the hole injection layer, the hole transport layer, the organic electroluminescence layer, the electron transport layer and the electron injection layer.

10. The organic electroluminescence display device of claim 1, wherein a material of the electrochromic medium layer is at least one selected from a group consisting of transition metal oxide, Prussian compound, viologens, conductive polymer, transition metal, lanthanide coordination complexes, metallopolyiners, metal phthalocyanines and a combination thereof.

11. The organic electroluminescence display device of claim 10, wherein the transition metal oxide is at least one selected from a group consisting of $WO_3$, $MoO_3$, $V_2O_5$, $Nb_2O_5$, $Ir(OH)_3$, $NiO_xH_y$, and a combination thereof.

12. The organic electroluminescence display device of claim 10, wherein the Prussian compound is at least one selected from a group consisting of $[Fe^{III}Fe^{II}(CN)_6]^-$, $[Fe^{III}Fe^{III}(CN)_6]$, $[Fe^{II}Fe^{II}(CN)_6]^{2-}$ and a combination thereof.

13. The organic electroluminescence display device of claim 10, wherein the viologensis comprises 1,1'-disubstituted-4,4'-bipyridinium salts.

14. The organic electroluminescence display device of claim 10, wherein the conductive polymer is at least one selected from a group consisting of polypyrrole, polythiophene, polyaniline, PEDOT and a combination thereof.

15. The organic electroluminescence display device of claim 10, wherein the transition metal, lanthanide coordination complexes and metallopolymers are at least one selected from a group consisting of metal hydride, nitrosyl, oxo molybdenum complexes, poly-$[Ru^{II}(vbpy)_2(py)_2]^-Cl_2$ and a combination thereof.

16. The organic electroluminescence display device of claim 10, wherein the metal phthalocyanines comprises $[Lu(Pc)_2]$.

* * * * *